United States Patent [19]
Okase

[11] Patent Number: 5,903,711
[45] Date of Patent: May 11, 1999

[54] HEAT TREATMENT APPARATUS AND HEAT TREATMENT METHOD

[75] Inventor: Wataru Okase, Sagamihara, Japan

[73] Assignee: Toyko Electron Limited, Tokyo-to, Japan

[21] Appl. No.: 08/816,776

[22] Filed: Mar. 19, 1997

[30] Foreign Application Priority Data

Mar. 26, 1996 [JP] Japan .................................. 8-096185

[51] Int. Cl.$^6$ ................ F26B 3/30; F26B 19/00
[52] U.S. Cl. ............ 392/418; 392/416; 219/405; 219/390; 432/241; 432/152; 118/724; 118/725
[58] Field of Search .................... 432/241, 5, 6, 432/11, 152, 253; 219/390, 405, 411; 392/416, 418; 118/724, 725

[56] References Cited

U.S. PATENT DOCUMENTS

| | | | |
|---|---|---|---|
| 5,148,714 | 9/1992 | McDiarmid | 392/416 |
| 5,156,820 | 10/1992 | Wong et al. | 392/416 |
| 5,308,955 | 5/1994 | Watanabe | 219/390 |
| 5,444,217 | 8/1995 | Moore et al. | 219/405 |
| 5,453,124 | 9/1995 | Moslehi et al. | 118/725 |
| 5,482,559 | 1/1996 | Imai et al. | 432/241 |
| 5,536,918 | 7/1996 | Ohkase et al. | 392/418 |
| 5,567,152 | 10/1996 | Morimoto | 432/5 |
| 5,632,820 | 5/1997 | Taniyama et al. | 432/241 |

OTHER PUBLICATIONS

Japanese Publication, JP 405152225 A, Jun. 1993.

*Primary Examiner*—Teresa Walberg
*Assistant Examiner*—Jiping Lu
*Attorney, Agent, or Firm*—Smith, Gambrell & Russell, LLP; Beveridge, DeGrandi, Weilacher & Young Intellectual Property Group

[57] ABSTRACT

A wafer to be heat-treated is placed in a heat treatment chamber defined by a heat treatment vessel, and the wafer is heat-treated by radiant heat radiated by a heat source. A gas is supplied through a gas passage formed along the outer surface of an inner wall of the heat treatment vessel and having a portion extending near the heat source. The gas heated in the portion of the gas passage extending near the heat source by the heat source is blown toward a substantially central portion of the wafer as complementary heating means for increasing the temperature of the central portion of the wafer.

18 Claims, 4 Drawing Sheets

HEAT TREATMENT APPARATUS AND HEAT TREATMENT METHOD

BACKGROUND OF THE INVENTION

1. Field of the Invention

The present invention relates to a heat treatment apparatus and a heat treatment method.

2. Description of the Related Art

Various heat treatment apparatuses are employed in a semiconductor device fabricating process for subjecting a semiconductor wafer, i.e., a workpiece, to oxidation, diffusion, CVD (chemical vapor deposition), annealing and such. A representative batch heat treatment apparatus among those known heat treatment apparatus has a vertical reaction tube defining a heat treatment chamber which receives wafer boat holding a plurality of wafers, for example, 150 wafers, at predetermined intervals in a vertical stack, and subjects the plurality of wafers to a heat treatment in an atmosphere of a processing gas.

This known batch heat treatment apparatus is capable of heat-treating a plurality of wafers simultaneously and is satisfactory to some extent. However, since the upper wafers held in an upper portion of the wafer boat and the lower wafers held in a lower portion of the wafer boat are spaced a relatively long distance apart, the upper wafers are brought first into a hot environment in the heat treatment chamber and are taken last out of the hot environment, and operations for loading and unloading the heat treatment chamber need time, it is hard to heat all the wafers evenly by a heat treatment in which the temperature is raised and lowered quickly.

There have been proposed single-wafer heat treatment apparatuses capable of carrying out a heat treatment method requiring rapid heating and rapid cooling suitable for processing wafers of a large diameter and for fabricating miniaturized semiconductor devices. These previously proposed single-wafer heat treatment apparatuses are classified into those of a hot wall type which heat a heat treatment chamber together with a wafer by a heating means disposed outside the heat treatment chamber, and those of a cold wall type which heat only a wafer placed in a heat treatment chamber through a susceptor disposed within the processing chamber.

However, when a wafer is heated by those previously proposed heat treatment apparatus of either the hot wall type or the cold wall type, there is a tendency that the temperature of the central portion of the wafer starts rising later than that of the peripheral portion of the wafer and, consequently, that the surface of the wafer is heated in an irregular temperature distribution while the wafer is being heated to a desired temperature. Particularly, in the heat treatment apparatus of the cold wall type, the irregularity of the temperature distribution in the surface of the wafer is increased even in a heat-treating period after the wafer has been heated to the desired temperature by the process gas of a low temperature applied to the heated wafer. Such an irregular temperature distribution in the surface of the wafer tends to deteriorate the uniformity of heat-treating, such as film formation. Moreover, the process gas adsorbed by the wafer needs time to be heated to a temperature equal to that of the wafer, so that heat treatment apparatus has a tendency to delay the reaction between the processing gas and the wafer, deteriorate the quality of the product and reduce the throughput of the process.

SUMMARY OF THE INVENTION

The present invention has been made to solve those problems in the prior art and it is therefore an object of the present invention to provide a heat treatment apparatus and a heat treatment method capable of heating a wafer to be heat-treated uniformly and quickly, of heat-treating the wafer in an improved quality, and/or increasing the throughput of the process.

A first aspect in accordance with the present invention is a heat treatment apparatus comprising: a heat treatment vessel having an inner wall defining a heat treatment chamber to contain a wafer to be heat-treated; a heat source disposed outside the heat treatment vessel, for heating the wafer by radiant heat; and a first gas passage formed along the outer surface of the inner wall of the heat treatment vessel and having a portion extending near the heat source; wherein the first gas passage is connected to a first gas outlet through which a process gas heated by the heat source is blown into the heat treatment chamber, and the first gas outlet is formed at a position corresponding to a central portion of the wafer placed in the heat treatment chamber.

The heat treatment apparatus may be provided with a second gas passage formed along the outer surface of the wall of the heat treatment vessel and having a portion extending near the heat source, and a second gas outlet formed at a position corresponding to a peripheral portion of the wafer placed in the heat treatment chamber for blowing the gas heated by the heat source into the heat treatment chamber.

A second aspect in accordance with the present invention is a heat treatment method to be carried out by a heat treatment apparatus comprising a heat treatment vessel having an inner wall defining a heat treatment chamber to contain a wafer to be heat-treated, a heat source disposed outside the heat treatment vessel for heating the wafer by radiant heat, and a first gas passage formed along the outer surface of the inner wall of the heat treatment vessel and having a portion extending near the heat source, wherein the first gas passage is connected to a first gas outlet through which a process gas heated by the heat source is blown into the heat treatment chamber, and the first gas outlet is formed at a position corresponding to a central portion of the wafer placed in the heat treatment chamber, said heat treatment method comprising steps of: loading the wafer into the heat treatment chamber; moving the wafer to a heat treatment position near the heat source, while blowing the gas heated in the first gas passage by the heat source through the first gas outlet toward the central portion of the wafer; and heat-treating the wafer disposed at the heat treatment position.

A third aspect in accordance with the present invention is a heat treatment method to be carried out by a heat treatment apparatus comprising a heat treatment vessel having an inner wall defining a heat treatment chamber to contain a wafer to be heat-treated, a heat source disposed outside the heat treatment vessel for heating the wafer by radiant heat, a first gas passage formed along the outer surface of the inner wall of the heat treatment vessel and having a portion extending near the heat source, and a second gas passage formed along the outer surface of the wall of the heat treatment vessel and having a portion extending near the heat source; wherein the first gas passage is connected to a first gas outlet through which a process gas heated by the heat source is blown into the heat treatment chamber, the first gas outlet is formed at a position corresponding to a central portion of the wafer placed in the heat treatment chamber, and wherein the second gas passage is connected to a second gas outlet through which a process gas heated by the heat source is blown into the heat treatment chamber, the second gas outlet is formed at a position corresponding to a peripheral portion of the wafer; said heat treatment process comprising steps of: loading a wafer into the heat treatment chamber; moving the wafer to a heat treatment position near the heat source, while blowing the gas heated in the first gas passage by the heat source through the first gas outlet toward the central portion of the wafer and blowing the gas heated in the second gas passage by the heat source through the second gas outlet toward the peripheral portion of the wafer at a flow rate lower than that at which the gas is blown through the first gas outlet; and heat-treating the wafer disposed at the heat treatment position.

BRIEF DESCRIPTION OF THE DRAWINGS

The above and other objects, features and advantages of the present invention will become apparent from the following description taken in connection with the accompanying drawings, in which.

DETAILED DESCRIPTION OF THE PREFERRED EMBODIMENTS

Figure 1:
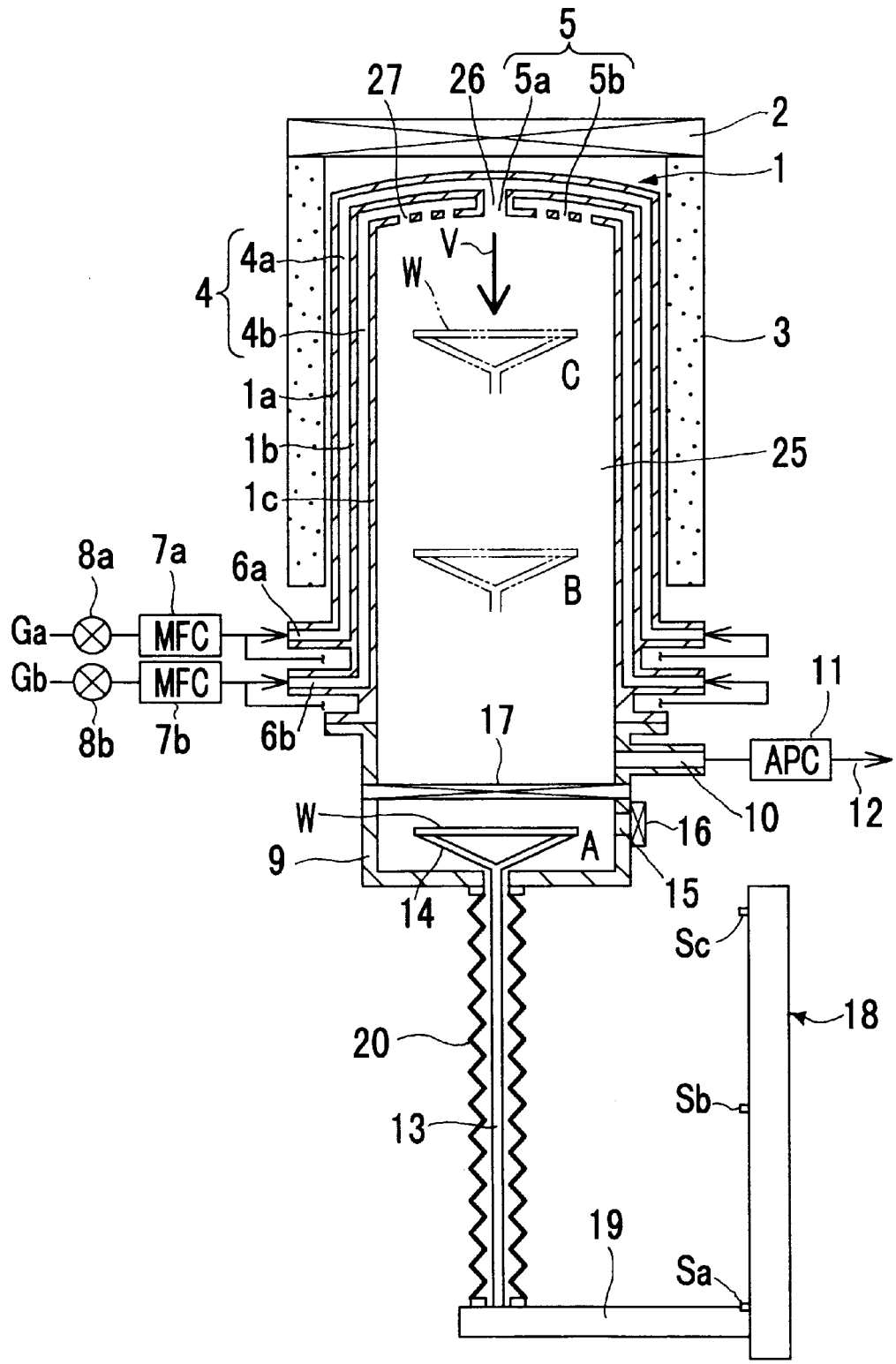
FIG. 1 is a longitudinal sectional view of a heat treatment apparatus in a first embodiment according to the present invention.

Referring to FIG. 1, a heat treatment apparatus in a first embodiment according to the present invention comprises a process tube (heat treatment vessel) 1 defining a heat treatment chamber 25 in which a semiconductor wafer W to be heat-treated is subjected to a desired process, such as an oxidation process. The process tube 1 is a tube having a closed upper end and an open lower end and made of a heat-resistant material, such as quartz. The construction of the process tube 1 will more specifically be described later.

A flat heater 2, i.e., a heat source for heating the wafer W contained in the process tube 1 at a high temperature in a range of, for example, 800 to 1200° C., is disposed in a horizontal position above the process tube 1. The flat heater 2 is provided with a resistance heating element formed by winding a heat generating wire, such as a kanthal wire, i.e., a heat generating wire of an Fe/Cr/Al alloy, or a $MoSi_2$ wire, in a spiral shape or bending the same in a zigzag shape.

Preferably, the heater 2 is formed in a diameter far greater than that of the wafer W, for example, a diameter twice that of the wafer W or above. to apply radiant heat uniformly to the wafer W. The peripheral portion of the heater 2 may be curved down or projected down to heat portions of the surface of the wafer W uniformly by the heater 2 having a finite size.

Preferably, an equalizer of $Al_2O_3$ (alumina), SiC (silicon carbide) or the like, not shown, capable of preventing contamination by heavy metals and of being heated uniformly is disposed between the heater 2 and the process tube 1 so as to cover the upper end and the side surface of the process tube 1. The process tube 1 and the heater 2 are surrounded by a heat insulating member 3 of a heat-resistant material, such as quartz wool. Thus, the heat treatment apparatus in the first embodiment is of the hot wall type.

Preferably, the heat insulating member 3 is covered with, for example, a double-wall casing, not shown, of a stainless steel serving as a water jacket for preventing the thermal influence of the heat insulating member 3 on the ambience.

A gas passage 4 having a first gas passage 4a and a second gas passage 4b is formed along the wall of the process tube 1 to carry a predetermined process gas, such as a gas for oxidation, to a position near the heater 2. The process gas heated by the heater 2 is blown toward the wafer W placed in the heat treatment chamber 25 of the process tube 1 as a complementary heating means for increasing the temperature of the wafer W through a gas outlet 5. The gas outlet 5 comprises a first gas outlet 5a having a single opening 26, and a second gas outlet 5b having a plurality of openings 27. The opening 26 of the first gas outlet 5a is formed in a central portion of the upper end of the process tube 1, and the plurality of openings 27 of the second gas outlet 5b are formed around the opening 26 of the first gas outlet 5a in the upper end of the process tube 1.

The process tube 1 has an outer wall 1a, an intermediate wall 1b and an inner wall 1c combined in a three-wall structure. The first gas passage 4a is a space between the outer wall 1a and the intermediate wall 1b, opening into the first gas outlet 5a, and the second gas passage 4b is a space between the intermediate wall 1b and the inner wall 1c, opening into the second gas outlet 5b.

First gas inlets 6a are formed at equal angular intervals in the outer wall 1a of the process tube 1 so as to be connected to the first gas passage 4a to supply a process gas uniformly into the annular first gas passage 4a, and second gas inlets 6b are formed in the intermediate wall 1b of the process tube 1 so as to be connected to the second gas passage 4b to supply the process gas uniformly into the annular second gas passage 4b. The outer wall 1a may be provided with only one first gas inlet and the intermediate wall may be provided with only one second gas inlet.

The first gas inlets 6a are connected through a flow controller 7a and a valve 8a to a gas source Ga, and the second gas inlets 6b are connected through a flow controller 7b and a valve 8b to a gas source Gb to control the flow rates of the process gasses flowing through the gas outlets 5a and 5b individually. The process gasses supplied from the gas sources Ga and Gb may be of the same kind or of different kinds. In this embodiment, the process gasses supplied from the gas sources Ga and Gb are of the same kind. Preferably, each of the gas sources Ga and Gb is capable of selectively supplying the process gas or an inert gas, such as nitrogen gas ($N_2$).

The first gas outlet 5a is formed at a position corresponding to a portion (central portion) of the circular wafer W as disposed in the process tube 1 which is heated at a relatively low temperature raising rate. The temperature of the central portion of the wafer W starts rising after the temperature of the peripheral portion of the wafer W has started rising when the wafer W is heated by radiant heat radiated by the heater 2. Thus, the process gas heated at a high temperature is blown positively toward the central portion of the wafer W as a complementary heating means to heat the central portion of the wafer W. In this case, because of the heat transferred from the process gas to the wafer W, the central portion of the wafer W is heated at a temperature raising rate equal to that at which the peripheral portion of the same is heated. In this heat treatment apparatus, the process gas is blown through the first gas outlet 5a at a flow rate higher than that at which the process gas is blown through the second gas outlet 5b.

Preferably, the flow rate V of the process gas that flows through the first gas outlet 5a is in the range of 0.1 to 2.5 m/s to heat the central portion of the wafer W properly at a temperature raising rate substantially equal to that at which the peripheral portion of the same is heated. The temperature of the central portion of the wafer W cannot properly be raised if the flow rate V of the process gas is lower than 0.1 m/s, and the temperature of the central portion of the wafer W increases excessively rapidly if the flow rate V of the process gas is higher than 2.5 m/s. The diameter of the first gas outlet 5a is dependent on the total quantity of the process gas required by the process. For example, the preferable diameter of the first gas outlet 5a is about 60 mm when the total quantity of the process gas is ten liters.

A load-lock vessel 9 made of a corrosion-resistant material, such as a stainless steel, is joined to the lower end of the process tube 1. The wafer W is loaded into and unloaded from the process tube 1 through the load-lock vessel 9. A discharge port 10 is formed in the side wall of the load-lock vessel 9 to discharge spent gases or the inert gas. The discharge port 10 is connected through a pressure controller 11, which controls the interior of the process tube 1 at a predetermined pressure, such as the atmospheric pressure, to a discharge system 12.

A vertical lifting shaft 13 made of, for example, quartz is extended axially movably through a hole formed in a central portion of the bottom wall of the load-lock vessel 9, and a wafer support unit 14 made of, for example, quartz is joined to the upper end of the lifting shaft 13. The wafer support unit 14 comprises, for example, three support arms extended obliquely upward from the upper end of the lifting shaft 13 so as to support the wafer W at three points in its periphery.

An opening 15 through which the wafer W is put onto and taken out from the wafer support 14 is formed in the side wall of the load-lock vessel 9, and the opening 15 is opened and closed by a gate valve 16. The load-lock vessel 9 is provided with a shutter 17 to isolate the interior of the load-lock vessel 9 from the interior of the process tube 1. The shutter 17 is opened to connect the interior of the load-lock vessel 9 to that of the process tube 1. Preferably, the shutter 17 comprises, for example, a pair of shutter plates which are moved horizontally toward and away from each other by pneumatic cylinder actuators or the like for closing and opening.

The lifting shaft 13 is supported in an upright position on a lifting arm 19 included in a lifting mechanism 18 including, for example, a motor-driven linear actuator with its lower end resting on the lifting arm 19. In this embodiment, a space between the lifting shaft 13 and the opening formed in the bottom wall of the load-lock vessel 9 is sealed by a bellows 20 extended between the bottom wall of the load-lock vessel 9 and the lifting arm 19. The space between the lifting shaft 13 and the opening may be sealed by a shaft seal fitted in the opening. The lifting mechanism 18 is provided with position transducers Sa, Sb and Sc, such as optical sensors or potentiometers, to measure the position of the lifting arm 19 to determine the position of the wafer W.

Preferably, detection signals provided by the position transducers Sa, Sb and Sc are used for both controlling, for example, the flow rate of the process gas, the pressure of the spent gases and the like, and determining the position of the wafer W. Incidentally, the position transducer Sa detects the arrival of the lifting arm 19 at a position corresponding to a wafer transfer position A, the position transducer Sb detects the arrival of the lifting arm 19 at a position corresponding to a process gas flow control starting position B, and the position transducer Sc detects the arrival of the lifting arm 19 at a position corresponding to a wafer heat-treating position C. Preferably, the lifting arm 19 is provided with a rotative driving means, such as a motor, for rotating the lifting shaft 13 to enhance the uniformity of processing the surface of the wafer W.

A heat treatment process (operation) to be carried out by the heat treatment apparatus thus constructed will be described hereinafter. First, the wafer support 14 on the upper end of the lifting shaft 13 is positioned at the wafer transfer position A, and the wafer W is carried through the opening 15 into the load-lock vessel 9, and the wafer W is transferred to the wafer support 14. When transferring the wafer W to the wafer support 14, the interior of the process tube 1 is purged by the process gas supplied through all the gas supply lines and the gas inlets 6a and 6b so that there is no stagnant gas in the process tube 1. Preferably the pressure controller 11 keeps the interior of the process tube 1 at a positive pressure to prevent the external gases from flowing into the process tube 1 through the opening 15.

After the wafer W has been mounted on the wafer support 14, the shutter 17 is opened, the wafer W is raised toward the heat treatment position C by the lifting mechanism 18, and a heat treatment process, such as a thermal oxidation process, is started. Uniform temperature distribution on the surface of the wafer W is very important both during the heat treatment process and during raising or lowering the temperature of the wafer W. The control of the rising speed of the wafer W when loading the wafer W into the process tube 1, i.e., when moving the wafer W to the heat treatment position C is effective in reducing the irregularity of temperature distribution on the surface of the wafer W. Since the heat treatment apparatus is designed so that the sufficiently heated process gas is able to reach the wafer W, the heat transferred from the thus heated process gas to the wafer W, as well as the radiant heat radiated by the heater 2, is available as a control means for reducing the temperature differences between portions of the surface of the wafer W.

Although the wafer W is raised to the heat treatment position C at a relatively high moving speed which is effective in preventing an irregular temperature distribution in the surface of the wafer W, the temperature of the central portion of the wafer W heated by the radiant heat radiated by the heater 2 has a tendency to start rising after the temperature of the peripheral portion of the wafer W has started rising, while the wafer W is being moved to the heat treatment position C. To improve such an irregular wafer heating mode, the flow of the process gas is controlled after the wafer W has passed the process gas flow control starting position B so that the flow rate of the process gas flowing through the second gas inlets 6b is very low and the flow rate of the process gas flowing through the first gas inlet 6a is high enough to transfer a sufficient quantity of heat from the process gas to the central portion of the wafer W. Consequently, the process gas supplied through the first gas inlet 6a into the first gas passage 4a is heated sufficiently in a portion of the first gas passage 4a near the heater 2 by the heater 2, and the thus sufficiently heated process gas is blown through the first gas outlet 5a toward the central portion of the wafer W, while the wafer W is being raised. Therefore, the heat transferred from the process gas to the central portion of the wafer W enables the central portion of the wafer W to be heated at a temperature raising rate substantially equal to that at which the peripheral portion of the wafer W is heated, whereby irregularity in the temperature distribution in the surface of the wafer W is reduced to the least possible extent and, eventually, a uniform temperature distribution is established in the surface of the wafer W.

In a state where the wafer W is held at the heat treatment position C and is heated to a temperature nearly equal to a heat treatment temperature, there is no temperature difference between the processing gas and the wafer W and therefore the action of the process gas to control the temperature of the wafer W becomes ineffective. After this state has been established, the process gas is blown through the first gas outlet 5a and the second gas outlet 5b at substantially equal flow rates over the entire surface of the wafer W to accomplish uniform heat treatment. After the heat treatment process has been completed, the wafer W is lowered to the wafer transfer position A, the processed wafer W is taken out from the load-lock vessel 9, and another wafer W to be heat-treated is carried into the load-lock vessel 9. A heat treatment cycle including carrying a wafer into the load-lock vessel 9, raising the wafer to the heat treatment position C, controlling the temperature of the wafer, heat-treating the wafer, lowering the heat-treated wafer to the wafer transfer position A and taking out the heat-treated wafer from the load-lock vessel 9 is repeated to heat-treat wafers successively one at a time.

The temperature of the wafer W decreases when the heat-treated wafer W moves away from the heater 2 and the heat-treated wafer W is lowered after the completion of the heat treatment process. If the process gas remains in the process tube 1 while the heat-treated wafer W is being lowered and the temperature of the heat-treated wafer W is decreasing, the reaction between the process gas and the wafer W continues while the wafer W is being lowered, obstructing the formation of a sharp interface. Therefore, it is preferable to terminate the reaction completely by supplying an inert gas, such as nitrogen gas, into the process tube 1 to purge the process tube 1 completely of the process gas. It is preferable to control the flow rates of the inert gas at the first gas outlet 5a and the second gas outlet 5b so that the temperature difference between the central portion and the peripheral portion of the wafer W reduced to the least possible extent. Since the temperature of the central portion of the wafer W decreases more slowly than that of the peripheral portion of the wafer W, heated nitrogen gas is blown against only the peripheral portion of the wafer W to reduce the temperature difference between the central portion and the peripheral portion of the wafer W.

The wafer W to be heat-treated can be carried quickly into the process tube 1, the wafer W can quickly be taken out from the process tube 1 after the same has been subjected to the heat treatment process for a predetermined time, and the heat history of the wafer can be limited to the least possible extent. Thus, the miniaturization of a semiconductor device is possible. The foregoing heat treatment process is capable of rapidly raising the temperature of the wafer W in a uniform temperature distribution in the surface of the wafer W by the application of additional heat to the central portion of the wafer W, which is difficult to heat, by blowing the process gas heated by the heater 2 toward the portion difficult to heat, when the wafer W is heated by the radiant heat radiated by the heater 2. The process gas of a temperature equal to that of the wafer W is blown toward the wafer W during the heat treatment process after heating the wafer W to a predetermined temperature. Thus, the surface of the wafer W can uniformly be heated, the reaction progresses rapidly and the treatment of the surface of the wafer W, such as formation of an oxide film over the surface of the wafer W, can efficiently and uniformly carried out. Consequently, the product is produced in an improved quality and the heat treatment apparatus operates at an increased throughput.

In this heat treatment apparatus, the heater 2, i.e., a heat source, for heating the wafer W by radiant heat is disposed outside the process tube 1 having the heat treatment chamber 25 to contain the wafer W for heat treatment, the gas passages 4 for carrying the process gas near to the heater 2 are formed along the outer surface of the process tube 1, and the process gas heated by the heater 2 is blown through the gas outlet 5 toward the wafer W held within the heat treatment chamber 25 as the complementary heating means for heating the wafer W. Therefore, the heat treatment apparatus has a simple construction, and is capable of rapidly raising the temperature of the wafer W in a uniform temperature distribution, of producing a product of an improved quality, and of heat-treating wafers at an increased throughput. Since the gas outlets 5 include at least the first gas outlet 5a formed at the position corresponding to the central portion of the wafer W as positioned at the heat treatment position C, the temperature of the central portion of the wafer W, i.e., the portion which is difficult to heat, can positively be raised. Since the flow rates of the process gas at the gas outlets 5 are in the range of 0.1 to 2.5 m/s, the central portion of the wafer W, which is difficult to heat, can properly be heated.

Heat treatment apparatuses in further embodiments according to the present invention will be described with reference to FIGS. 2 to 4, in which parts like or corresponding to those of the heat treatment apparatus in the first embodiment shown in FIG. 1 are designated by the same reference characters.

Figure 2:
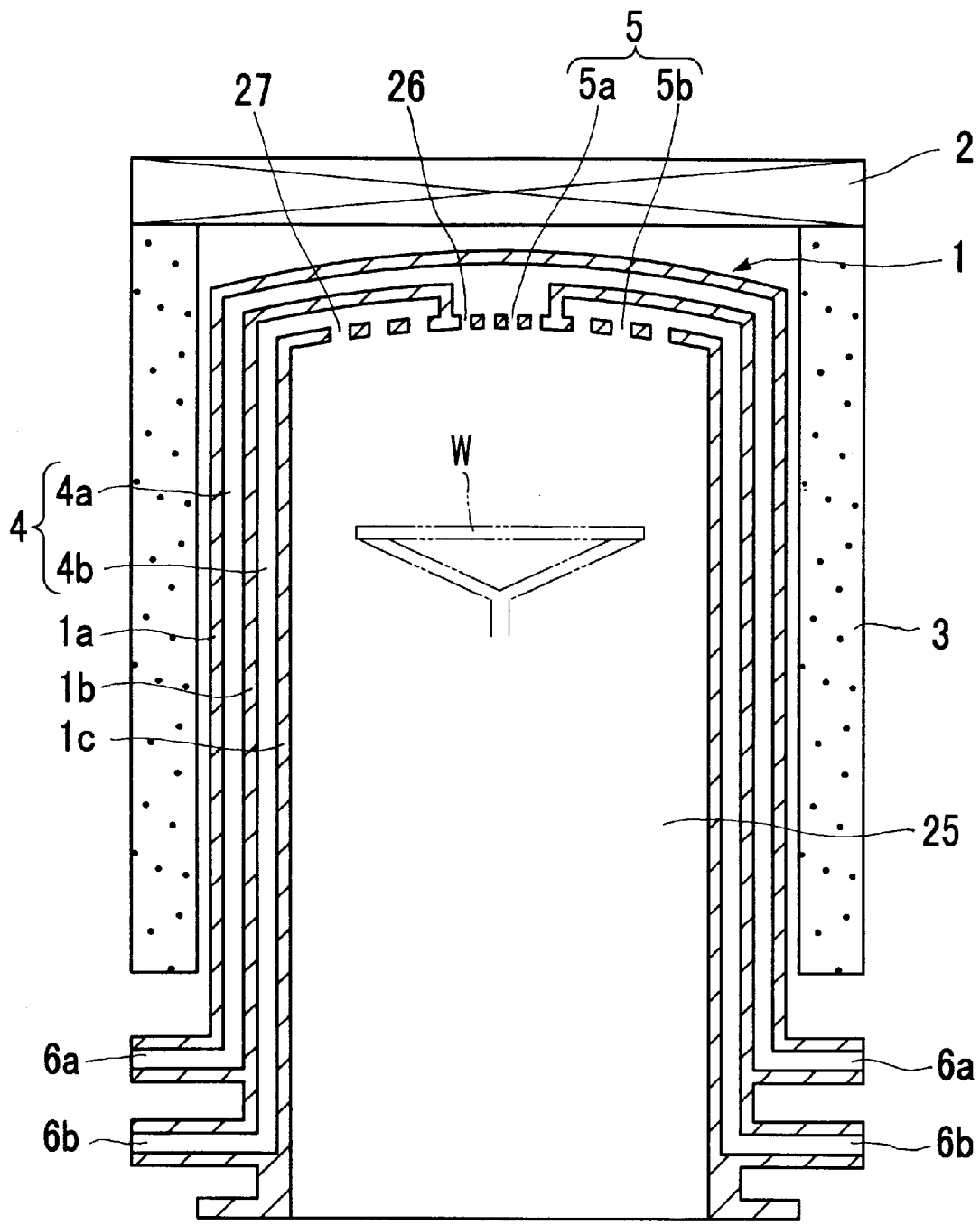
FIG. 2 is a longitudinal sectional view of an essential portion of a heat treatment apparatus in a second embodiment according to the present invention.

Referring to FIG. 2 showing a heat treatment apparatus in a second embodiment according to the present invention, a process tube (heat treatment vessel) 1 of a three wall construction comprises an inner wall having an upper portion provided with a first gas outlet 5a and a second gas outlet 5b. The first gas outlet 5a has a plurality of openings 26 and the second gas outlet 5b has a plurality of openings 27, as a result the upper portion of the inner wall is formed in the shape of a shower face. The second embodiment is the same in other respects as the first embodiment, and is capable of exerting the same effects as those exerted by the first embodiment.

Figure 3:
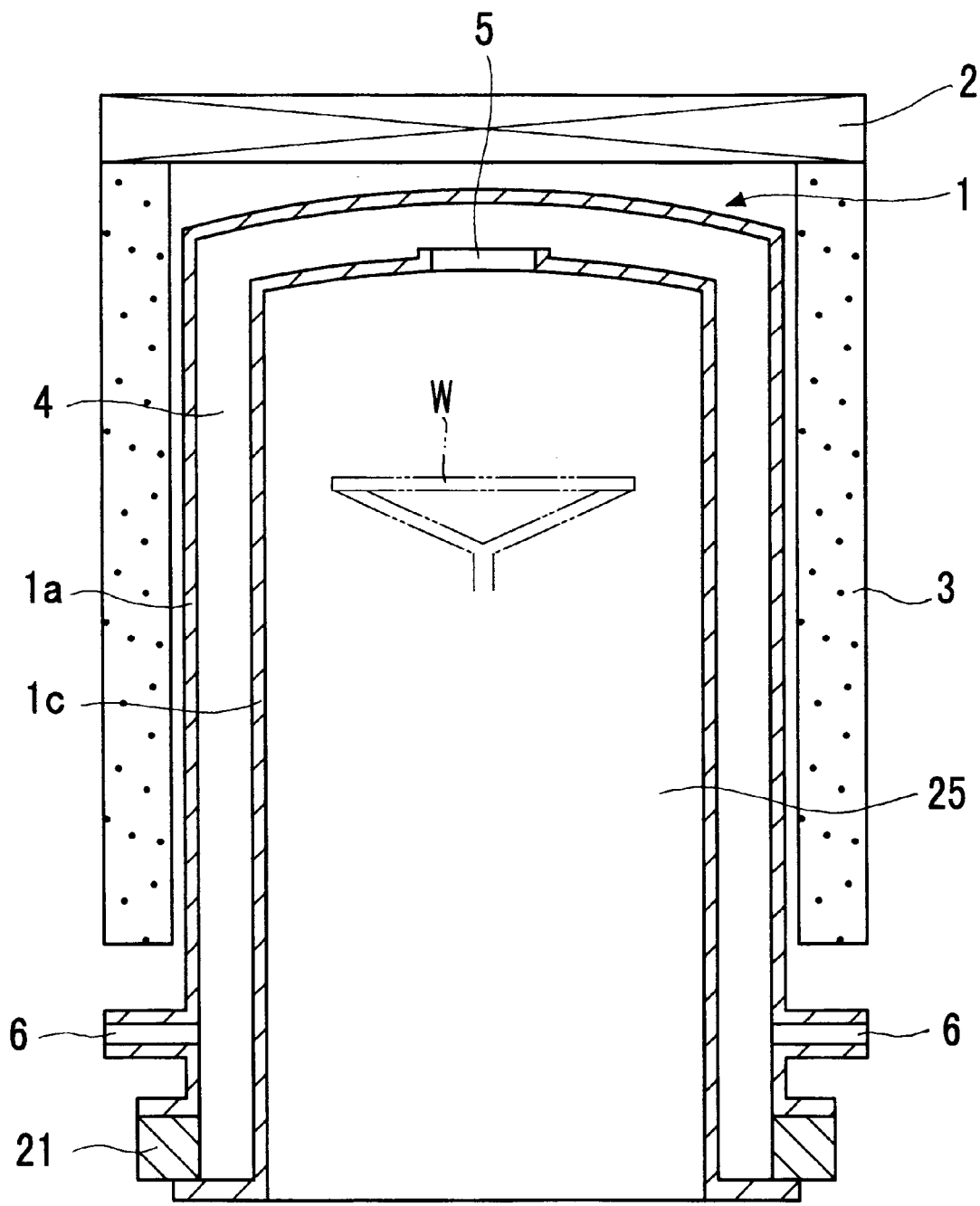
FIG. 3 is a longitudinal sectional view of an essential portion of a heat treatment apparatus in a third embodiment according to the present invention.

Referring to FIG. 3 showing a heat treatment apparatus in a third embodiment according to the present invention, the heat treatment apparatus is provided with a process tube 1 of a two-wall construction having an outer tube 1a and an inner tube 1c. The outer tube 1a and the inner tube 1c are detachably combined together, and are separated from each other to facilitate cleaning. A gas passage 4 is formed between the outer tube 1a and the inner tube 1c, and a single gas outlet 5 is formed in a central portion of the upper end portion of the inner tube 1c. Gas inlets 6 are formed in the side wall of the outer tube 1a. The lower ends of the outer tube 1a and the inner tube 1c are joined to a flange 21. Since the heat treatment apparatus is provided with the single gas outlet 5 in the inner tube 1c, the process gas cannot be blown through a plurality of regions of the upper end portion of the inner tube 1c at different flow rates. However, the process gas of a high temperature can be blown toward a central portion of a wafer W, which is difficult to heat, to raise the temperature of the central portion positively. Thus, the effects of the heat treatment apparatus in the third embodiment are substantially the same as those of the heat treatment apparatuses in the foregoing embodiments.

Figure 4:
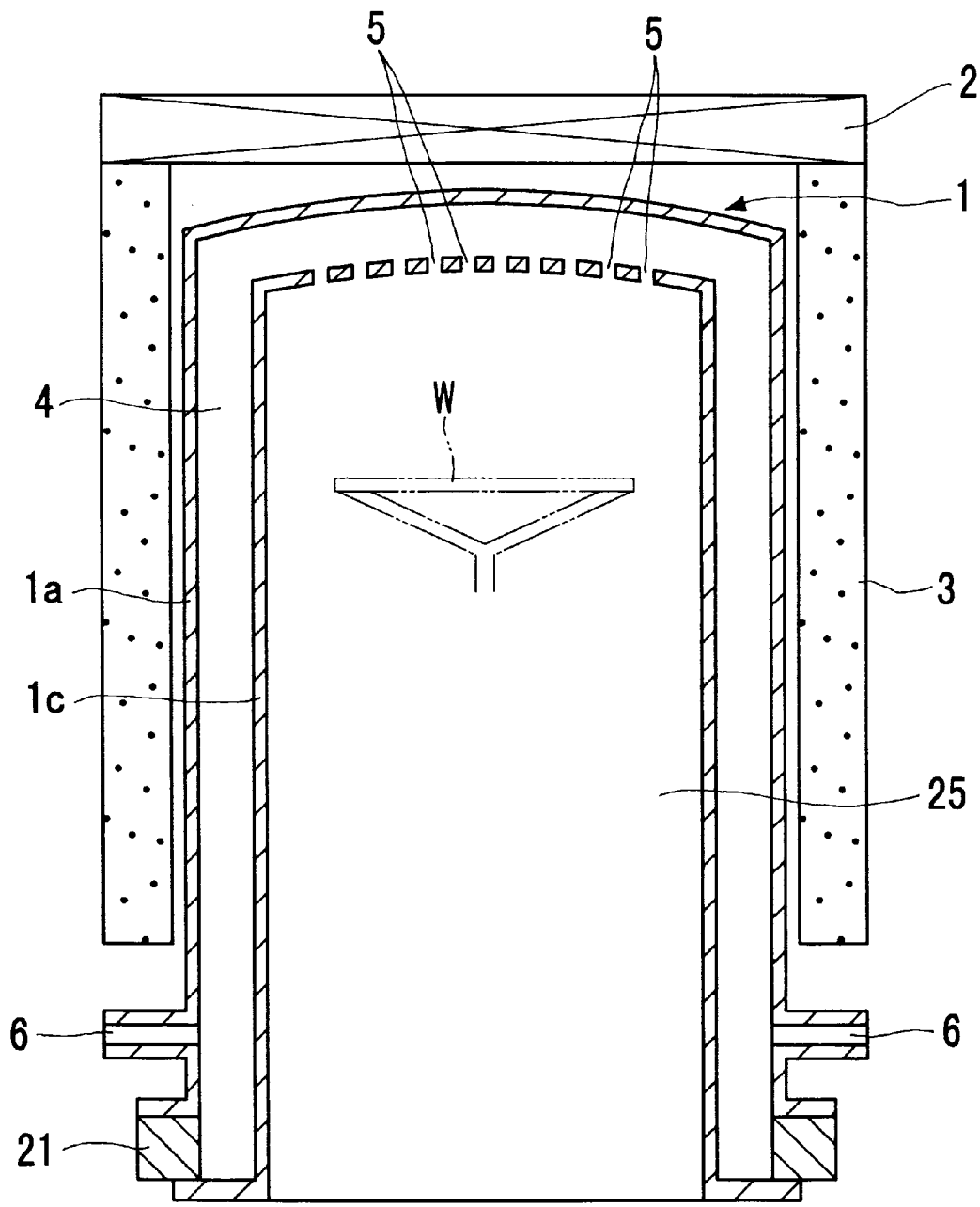
FIG. 4 is a longitudinal sectional view of an essential portion of a heat treatment apparatus in a fourth embodiment according to the present invention.

Referring to FIG. 4 showing a heat treatment apparatus in a fourth embodiment according to the present invention, the heat treatment apparatus, similarly to the heat treatment apparatus in the third embodiment, is provided with a process tube 1 of a two-wall construction having an outer tube 1a and an inner tube 1c. A gas passage 4 is formed between the outer tube 1a and the inner tube 1c, and a plurality of gas outlets 5 are formed in a central portion of the upper end portion of the inner tube 1c. In the third and the fourth embodiment, the outer tube 1a and the inner tube 1c may be combined in a unitary member, and a discharge port may be formed in the side wall of the process tube 1.

Although the preferred embodiments of the present invention have been described, the present invention is not limited thereto in its practical application and various changes and variations may be made therein without departing from the scope of the present invention. For example, the process tube may be made of silicon carbide (SiC). Preferably the process tube made of silicon carbide is coated with high-purity silicon carbide. Although the heater comprising the resistance heat generating element is a desirable heat source, a lamp may be employed as the heat source. The heat treatment apparatus is capable of processing workpieces other than semiconductor wafers; the present invention is applicable to processing substrates for LCDs. The present invention is applicable to heat treatment processes other than an oxidation process, such as a nitriding process, a CVD process, a diffusion process, an annealing process and such.

As is apparent from the foregoing description, the present invention exerts the following excellent effects.

(1) The wafer to be heat treated can rapidly and uniformly be heated and can be processed in an improved quality at an increased throughput, because the process gas heated by the heat source is blown toward the wafer as a complementary heating mans for increasing the temperature rising rate of the wafer, when the wafer is heated by the radiant heat radiated by the heat source for heat treatment.

(2) The heat treatment apparatus has a simple construction and is capable of rapidly and uniformly heating the wafer, and of processing the wafer in an improved quality at an increased throughput. It is because the heat source for heating the wafer by radiant heat is disposed outside the process vessel defining the heat treatment chamber in which the wafer is heat-treated, the gas passage for carrying the process gas near to the heat source is formed along the wall of the processing vessel, and the process gas heated by the heat source is blown through the gas outlet or gas outlets against the wafer as a complementary heating means for increasing the temperature rising rate of the wafer.

(3) The portion of the wafer difficult to heat can properly be heated, because at least one of the gas outlets is disposed at a position corresponding to the central portion of the wafer as disposed at the heat treatment position.

(4) The portion of the wafer difficult to heat can properly be heated, because the process gas is blown through the gas outlets at flow rates in the range of 0.1 to 2.5 m/s.

What is claimed is:

1. A heat treatment apparatus comprising:
   a heat treatment vessel having an inner wall defining a heat treatment chamber to contain a wafer to be heat-treated;
   a heat source disposed outside and above the heat treatment vessel, for heating the wafer by radiant heat;
   and a first gas passageway that includes a first portion that extends with the inner wall of the heat treatment vessel and a second portion that extends adjacent the heat source;
   wherein the first gas passageway includes a first gas outlet positioned below said beat source and opening directly into the heat treatment vessel such that a process gas, heated by the heat source, is blown into the heat treatment chamber, and the first gas outlet is positioned so as to correspond to a central portion of the wafer once placed in the heat treatment chamber so as to direct gas of said first gas passageway more toward the central portion of the wafer than a peripheral portion of the wafer;
   a wafer support structure;
   a wafer support position adjustment assembly in contact with said wafer support structure and having an elevation device that raises said wafer support structure within said heat treatment vessel;
   a first gas flow regulator for regulating a quantity of gas in said first gas passageway such that gas exiting said first outlet is provided in a sufficient quantity to the central portion of the wafer to be heat treated to heat the central portion of the wafer at a temperature raising rate substantially equal to that of the peripheral portion of the wafer, and
   said heat treatment apparatus further comprising a second gas passageway that extends external to said heat treatment vessel and has a second gas outlet that opens into said heat treatment chamber and is positioned so as to direct gas received in said second passageway to a peripheral portion of a wafer once placed in the heat treatment vessel, and wherein the heat treatment vessel has an inner tube serving as the inner wall, an outer tube, and an intermediate tube disposed between the inner tube and the outer tube, and the first portion of the first gas passageway is formed between the intermediate tube and the outer tube, and a portion of the second gas passageway is formed between the inner tube and the intermediate tube.

2. The heat treatment apparatus according to claim 1, wherein the second gas outlet has a plurality of openings which receive gas only from said second passageway.

3. The heat treatment apparatus according to claim 1, further comprising a second flow regulator and wherein the second gas passage ways is connected to said second flow regulator.

4. A heat treatment apparatus as recited in claim 1 wherein said first gas outlet represents the only outlet through which gas from said first gas passageway travels through.

5. A heat treatment apparatus comprising:
   a heat treatment vessel having a heat treatment chamber defined by an interior side section of said vessel and a top section of said vessel, said heat treatment chamber opening out at a bottom portion of said vessel so as to provide a wafer reception opening in said heat treatment chamber;
   a wafer support member;
   a wafer support positioning device for positioning said wafer support member within said heat treatment vessel;
   a heat source disposed above the heat treatment vessel so as to radiate heat into said heat treatment chamber;
   a first gas passageway having an inlet arranged for reception of process gas from a process gas source, an intermediate portion which passes between said heat source and top section of said heat treatment vessel and an outlet which receives gas from said intermediate portion and opens directly into said heat treatment chamber so as to direct the heated gas traveling through the intermediate portion of said first gas passageway sufficiently more toward a central portion of a wafer supported by said wafer support member than a peripheral portion of the wafer supported by said wafer support member to maintain a substantially uniform temperature rise in the wafer despite a greater rise in temperature in the peripheral portion of the wafer due to radiant heat from the heat source, and said heat treatment apparatus further comprising a second gas passageway having an inlet portion for receiving a gas source, an outlet and an intermediate portion extending between said beat source and said top section, and the outlet of said second gas passageway being arranged with respect to said vessel so as to direct gas in said second gas passageway more toward a peripheral portion of a wafer supported by said wafer supported member than a central portion thereof, and wherein said first and second gas passageway are independent gas passageways which prevent co-mingling of gases traveling in said first and second gas passageways until receipt of the gas from each gas passageway in said heat treatment chamber.

6. A heat treatment apparatus as in claim 5 wherein said top section of said heat treatment vessel includes a top cover which covers an upper end of said interior side section, and said outlet of said first gas passageway extends through and into contact with a central region of said top cover so as to be aligned with a central portion of said wafer support member.

7. A heat treatment apparatus as recited in claim 5 wherein said first gas passageway is arranged such that all gas in said first gas passageway is focused by said outlet toward a central portion of a wafer positioned on said wafer support member.

8. A heat treatment approach as recited in claim 7 wherein the outlet is defined by a single opening in said top section which receives all gas passing through said first gas passageway.

9. A heat treatment apparatus as recited in claim 5 wherein said heat source is a flat heater that has a bottom surface that extends parallel with a wafer supported on said wafer support member.

10. A heat treatment apparatus as recited in claim 5 wherein said wafer support member is a single wafer support member.

11. A heat treatment apparatus as recited in claim 5 further comprising gas flow supply means for varying gas flow directed in said heat treatment vessel through the outlet of said first gas passageway.

12. A heat treatment apparatus according to claim 11 wherein said gas flow control means directs gas flow into said heat treatment vessel from said first gas passageway at a rate of 0.1 m/s to 2.5 m/s.

13. A heat treatment apparatus as recited in claim 5 wherein said wafer support positioning device includes means for monitoring the position of said wafer support member when in said heat treatment vessel so as to initiate gas flow out of said outlet at a time when said wafer support member is between an initial wafer receipt location and a final heat treatment process position.

14. A heat treatment apparatus as recited in claim 5 wherein the outlet of said first gas passageway includes a plurality of openings all directed at a central portion of said wafer support member such that the outlet focuses all of the gas traveling in said first passageway mainly toward the central portion of the wafer.

15. A heat treatment apparatus as recited in claim 12 further comprising flow control means for varying a relative amount of gas output by said first and second gas passageways.

16. A heat treatment apparatus as recited in claim 15 further comprising wafer support position monitoring means for sensing the location of such wafer support member, and said flow control means being in communication with said wafer support positioning monitoring means such that, during upward movement of said wafer support positioning device from a load position toward a final processing position, said flow control means directs a greater amount of gas flow through said first gas passageway than said second gas passageway, and a greater amount of gas flow is directed through said second gas passageway than said first gas passageway when said wafer is being moved back from a final processing position toward the load position.

17. A heat treatment apparatus as recited in claim 12 wherein said heat treatment vessel includes an outer wall surrounding and outwardly spaced from said interior side section, and an intermediate wall surrounding said interior side section and positioned between said outer wall and said interior side section of said vessel; and the intermediate portion of said first gas passageway extends between said intermediate wall and said outer wall prior to extending between said heat source and said top section, and the intermediate portion of said second gas passageway extends between said intermediate wall and said interior side section prior to extending between said heat source and said top section.

18. A heat treatment apparatus as recited in claim 5 wherein said heat treatment vessel includes an outer wall surrounding said interior side section, and the intermediate portion of said first gas passageway extends between said outer wall and said interior side section prior to extending into a region between said heat source and top section, and all of the gas passing in said first passageway is focused by said outlet to the central portion of the wafer.

* * * * *